United States Patent
Ninomiya et al.

(10) Patent No.: US 7,829,417 B2
(45) Date of Patent: Nov. 9, 2010

(54) SEMICONDUCTOR APPARATUS AND METHOD OF MANUFACTURING SEMICONDUCTOR APPARATUS

(75) Inventors: Hitoshi Ninomiya, Kanagawa (JP); Yoshinao Miura, Kanagawa (JP); Yoshiya Kawashima, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 22 days.

(21) Appl. No.: 12/128,865

(22) Filed: May 29, 2008

(65) Prior Publication Data

US 2008/0299726 A1    Dec. 4, 2008

(30) Foreign Application Priority Data

May 29, 2007    (JP)    ............................. 2007-142100

(51) Int. Cl.
    *H01L 21/336*    (2006.01)
(52) U.S. Cl. ............................... 438/270; 257/E21.418
(58) Field of Classification Search .......... 257/E21.418; 438/270
    See application file for complete search history.

(56) References Cited

U.S. PATENT DOCUMENTS

| | | | | |
|---|---|---|---|---|
| 4,382,827 A | * | 5/1983 | Romano-Moran et al. | .. 438/232 |
| 5,072,266 A | * | 12/1991 | Bulucea et al. | ............. 257/330 |
| 5,361,110 A | * | 11/1994 | Haraguchi | ................... 396/402 |
| 5,631,110 A | * | 5/1997 | Shioiri et al. | .................. 430/5 |
| 5,994,758 A | * | 11/1999 | Hayashi | ...................... 257/536 |
| 6,653,026 B2 | * | 11/2003 | Pierrat et al. | ................... 430/5 |
| 2003/0030051 A1 | * | 2/2003 | Zhou | ........................... 257/15 |

FOREIGN PATENT DOCUMENTS

| JP | 2006-93430 | 4/2006 |
|---|---|---|
| JP | 2006-165441 | 6/2006 |

\* cited by examiner

*Primary Examiner*—Davienne Monbleau
*Assistant Examiner*—Matthew Reames
(74) *Attorney, Agent, or Firm*—Young & Thompson

(57) ABSTRACT

A semiconductor apparatus with a superjunction structure includes a gate electrode which fills a trench that is formed in an epitaxial layer, and a column region which is surrounded by the gate electrode in a plane view. A photomask for forming the column region is elaborated. The photomask has a compensation pattern that compensates a deformation of a photo resist pattern caused by photo interference and a deformation of the ion implantation region diffused by heat treatment. Therefore extending direction of the gate electrode and the outer edge of the column region are substantially parallel.

9 Claims, 8 Drawing Sheets

PRIOR ART

PRIOR ART

US 7,829,417 B2

SEMICONDUCTOR APPARATUS AND METHOD OF MANUFACTURING SEMICONDUCTOR APPARATUS

BACKGROUND OF THE INVENTION

1. Field of the Invention

The present invention relates to a semiconductor apparatus and a method of manufacturing a semiconductor apparatus and, particularly, to a semiconductor apparatus and a method of manufacturing a semiconductor apparatus with a power MOSFET structure.

2. Description of Related Art

Recently, in a vertical power metal oxide semiconductor field effect transistor (MOSFET), a superjunction structure is used for lower on-resistance and higher withstand voltage. A vertical power MOSFET with a superjunction structure is described in Japanese Unexamined Patent Application Publication No. 2006-93430 (Ninomiya).

FIGS. 7A and 7B show the technique which is described in Ninomiya. FIG. 7A shows the sectional structure of a power MOSFET 70 along the line 7A-7A, and FIG. 7B shows the layout on the upper surface of the power MOSFET 70. The power MOSFET 70 has a superjunction structure in which a column region 73 is formed in a drift region 72 which is formed on a semiconductor substrate 71. As shown in the upper-surface layout of FIG. 7B, the column regions 73 are equally spaced from each other in the power MOSFET 70. Above the semiconductor substrate 71, a trench (groove) which is deeper than a base region 74 and a source region 75 that are vertically disposed on the drift region 72 is formed. The drift region 72 and the semiconductor substrate 71 serve as a drain region. The trench is filled with a gate electrode 76 (i.e. a trench gate structure). If a bias voltage is applied between the gate electrode 76 and a source electrode 77 of the power MOSFET 70, a channel is formed in the base region 74 in the vicinity of the gate electrode 76. As a result, charges move between the source region 75 and a drain region through the channel, thereby entering the on-state.

As described above, the column regions 73 are equally spaced from each other in the power MOSFET which is described in Ninomiya. Therefore, charge imbalance does not occur. It is thereby possible to achieve a high withstand voltage by the superjunction structure.

Japanese Unexamined Patent Application Publication No. 2006-165441 (Ninomiya et al.) discloses a power MOSFET in which a column region in a device active area and a column region in a peripheral area have the same depth to thereby equalize the charge balance between the device active area and the peripheral area (cf. FIGS. 8A and 8B). In the power MOSFET 80, a depletion layer is generated uniformly in the device active area and the peripheral area, so that a depletion layer is uniformly thick. This improves the breakdown voltage of a device, thereby heightening a withstand voltage.

However, in the technique described in Ninomiya, the distance between the column region and the gate electrode is not uniform, which results in an increase in on-resistance. FIG. 9 shows the column region which can be considered based on FIG. 7B. The column region of the related art is circular. Thus, the distance between the column region and the gate electrode is not uniform, and accordingly the thickness of a channel is not uniform. Specifically, a current path is narrow in the part where the column region and the gate electrode is closest, and resistance is high in such a part. FIG. 10 shows a current path which can be considered based on Ninomiya. This causes an increase in on-resistance.

SUMMARY

In one embodiment, the present invention provides a method of manufacturing a semiconductor apparatus with a superjunction structure including a column region. The method includes forming a gate electrode in a mesh pattern in a semiconductor layer, forming a photo resist pattern for forming an ion implantation region in the semiconductor layer, the photo resist pattern being formed by using a photomask, the photomask having a compensation pattern in such a way that the compensation pattern is surrounded by the gate electrode in a plane view and a distance from one linear edge of the gate electrode to the compensation pattern is gradually-changed depending on a location on the one linear edge of the gate electrode, forming the ion implantation region by using the photo resist pattern, and performing heat treatment on the semiconductor layer.

In the semiconductor apparatus and the method of manufacturing the semiconductor apparatus according to the present invention, the distance between the column region and the gate insulating film is uniform, thereby allowing a channel thickness to be uniform. That is, the present invention enables suppression of an increase in on-resistance.

BRIEF DESCRIPTION OF THE DRAWINGS

The above and other objects and advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1A:
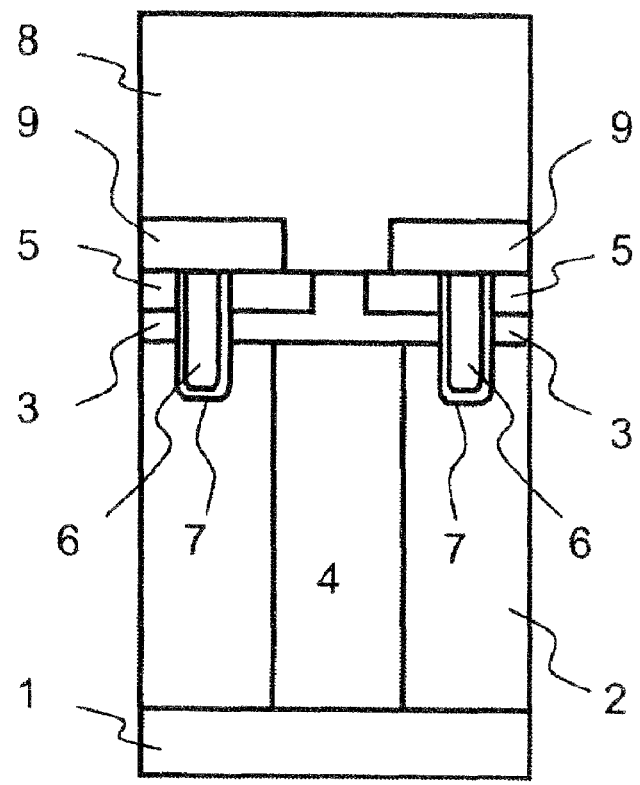
FIG. 1A is a view showing the sectional structure of a power MOSFET 100 according to a first embodiment of the present invention.
Figure 1B:
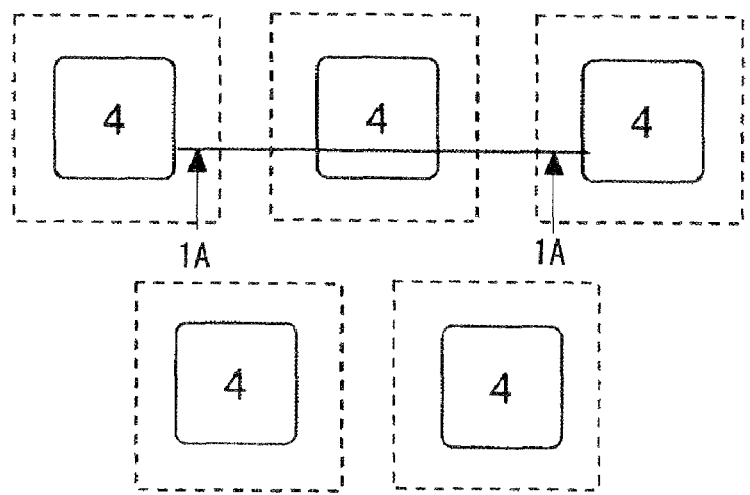
FIG. 1B a view showing the layout on the upper surface of the power MOSFET 100 according to the first embodiment.

An exemplary embodiment of the present invention is described hereinafter with reference to the drawings. FIG. 1A is a sectional view of semiconductor apparatus according to a first embodiment of the present invention. FIG. 1B is a plan view of the semiconductor apparatus shown in FIG. 1A. FIG. 1A shows the cross section along line 1A-1A in FIG. 1B.

A semiconductor substrate 1 shown in FIG. 1 may be an N+ type (first conductivity type) semiconductor substrate which is made of silicon or the like, for example. On the semiconductor substrate 1, a drift region 2 is formed. The drift region 2 may be an N-type (first conductivity type) semiconductor which is made of an epitaxial layer (semiconductor layer) that is formed by epitaxially growing silicon with phosphorus doping, for example. The drift region 2 and the semiconductor substrate 1 serve as the drain of a vertical power MOSFET.

A base region 3 is formed on the drift region 2. The base region 3 may be a P type (second conductivity type) semiconductor region which contains boron, for example. In the base region 3, a channel is formed in the vicinity of a gate electrode 6 during the operation of the vertical power MOSFET.

In the drift region 2, a plurality of column regions 4, which are P type semiconductors in columnar shapes, are placed. The column region 4 may be a P type (second conductivity type) semiconductor which contains boron, for example. The column region 4 is adjacent to the base region 3 and is formed deeply in the drift region 2 in a direction perpendicular to the base region 3.

A source region 5 is formed between the gate electrodes 6 on the base region 3. The source region 5 may be an N+ type (first conductivity type) semiconductor region which contains arsenic, for example. The source region 5 serves as the source of the power MOSFET.

Above the semiconductor substrate 1, a trench (groove) which is deeper than the source region 5 and the base region 3 is formed. The gate electrode 6 is formed inside the trench. The gate electrode 6 may be made of polysilicon, for example, and it fills the trench up to its opening with a gate insulation film 7 therebetween. The gate electrode 6 is formed in a mesh pattern. The gate electrode 6 and the source region 5, the gate electrode 6 and the base region 3, and the gate electrode 6 and the drift region 2 are respectively insulated from each other by the gate insulating film 7 which is formed to cover the inner surface of the trench. The structure in which the gate electrode 6 is buried in the trench that is formed above the semiconductor substrate 1 is called a trench gate structure.

A source electrode 8 is formed on the surface of the source region 5. An interlayer insulating film 9 is formed between the source electrode 8 and the gate electrode 6 though it is not electrically connected thereto. The gate electrode 6 may not fill the trench up to the opening, and both the gate electrode 6 and the interlayer insulating film 9 may be buried in the trench. In such a case, there is no need to form the interlayer insulating film 9 on the source region 5, thus eliminating the need for an alignment margin among the source region 5, the source electrode 8 and the interlayer insulating film 9, which enables the finer scale manufacturing of a power MOSFET.

FIG. 1B shows the layout when viewing the power MOSFET of FIG. 1A from above. Each column region 4 is formed in a rectangular shape. The column regions 4 are preferably equally spaced from each other. A method of forming the column region 4 in a rectangular shape is described hereinbelow.

Figure 2:
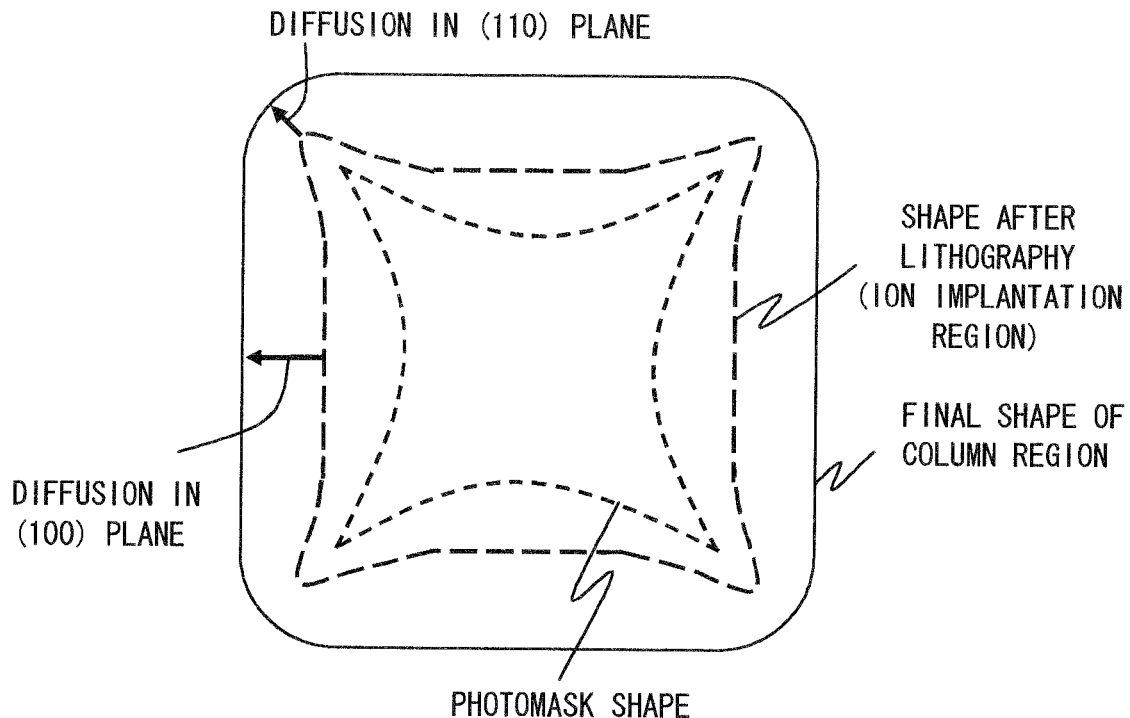
FIG. 2 is a view showing a compensation pattern of a mask when a column region is formed in a rectangular shape according to the first embodiment.

FIG. 2 shows a photomask shape of the column region, a photo resist pattern for implanting impurities of the column region and a final shape of the column region. The final shape of the column region 4 is formed by the process of patterning by lithography, impurity introduction by ion implantation, and diffusion by heat treatment. The photomask shape forms a compensation pattern that has four curved sides and four sharp corners. The compensation pattern is surrounded by the gate electrode in a plane view. A distance from one linear edge of the gate electrode to the compensation pattern is gradually-changed depending on a location on the one linear edge of the gate electrode. The shape of a photo resist pattern after lithography (an ion implantation region) is slightly enlarged by photo interference as shown in FIG. 2. The shape after lithography has four curved sides and four corners duller than the photomask shape. The ion implantation region is formed in such a way that a distance from the one linear edge of the gate electrode to the ion implantation region is gradually-changed depending on a location on the one linear edge of the gate electrode. The final shape of the column region is formed by the diffusion step which performs heat treatment.

Figure 3:
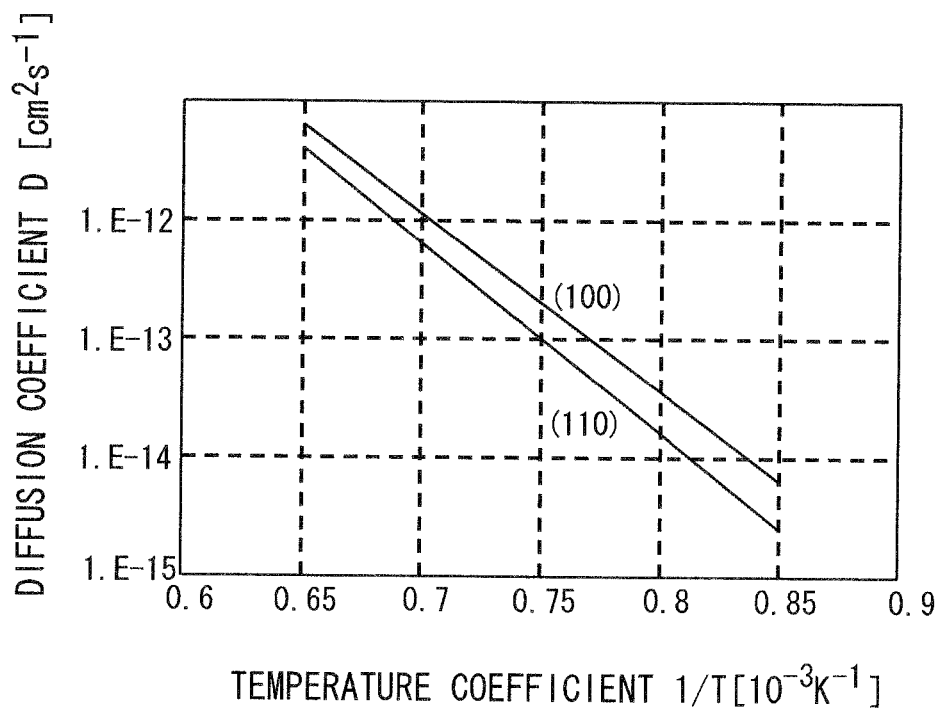
FIG. 3 is a view showing the temperature dependence of a diffusion coefficient by a difference in plane direction according to the first embodiment.

FIG. 3 shows the temperature dependence of a diffusion coefficient by a difference in crystal plane direction. As shown in FIG. 3, a diffusion coefficient is different between the (100) plane and the (110) plane. For example, at about 1000° C., the diffusion coefficient of boron in silicon in the (100) plane is about twice larger than the diffusion coefficient in the (110) plane. A diffusion distance is proportional to the square root of a diffusion coefficient. Thus, the diffusion distance in the (100) plane is about 1.4 times longer than the diffusion distance in the (110) plane.

The fact that the diffusion distance in the (100) plane is about 1.4 times longer than the diffusion distance in the (110) plane is taken into consideration. The shape after lithography is formed so that the final shape of the column region is rectangular. Specifically, the shape is formed in such a way that the distance to the gate electrode is shortest in the portion corresponding to the corner of the gate electrode in the outer edge of the ion implantation region which corresponds to the shape after lithography and the distance to the gate electrode is longest at the middle of one side of the outer edge of the ion implantation region. As a result, the final shape of the column region becomes rectangular. Thus, the distance from the column region to the gate insulating film is uniform. Because the column region is formed by thermal diffusion of an impurity, the corners of the column region are slightly rounded. The corners of the gate electrode are also slightly rounded if the gate insulating film is formed by thermal oxidation of silicon. Although the distance to the gate insulating film is partly slightly longer at the corners of the column region in the strictest sense, the region where the distance is uniform is significantly larger compared with the related art.

The operation of the semiconductor apparatus 100 is described hereinafter. Firstly, the case where a reverse bias voltage is applied between the drain region and the base region when a bias voltage is not applied between the gate electrode 6 and the source electrode 8 of the power MOSFET 100 is described. In such a case, a depletion layer is generated in each interface between the drift region 2 and the base region 3, between the drift region 2 and the column region 4, and between the column region 4 and the semiconductor substrate 1. As a result, the depletion layers are spread and joined to each other between the drain region and the source region 5 in off-state, thereby heightening the withstand voltage.

Next, the case where a bias voltage is applied between the gate electrode 6 and the source electrode 8 of the power MOSFET 100 is described. In such a case, because a voltage at the gate electrode 6 is high, a channel is formed in the base region 3 in the vicinity of the gate electrode 6. As a result, charges move between the source region 5 and the drain region through the channel, thereby entering the on-state.

Figure 9:
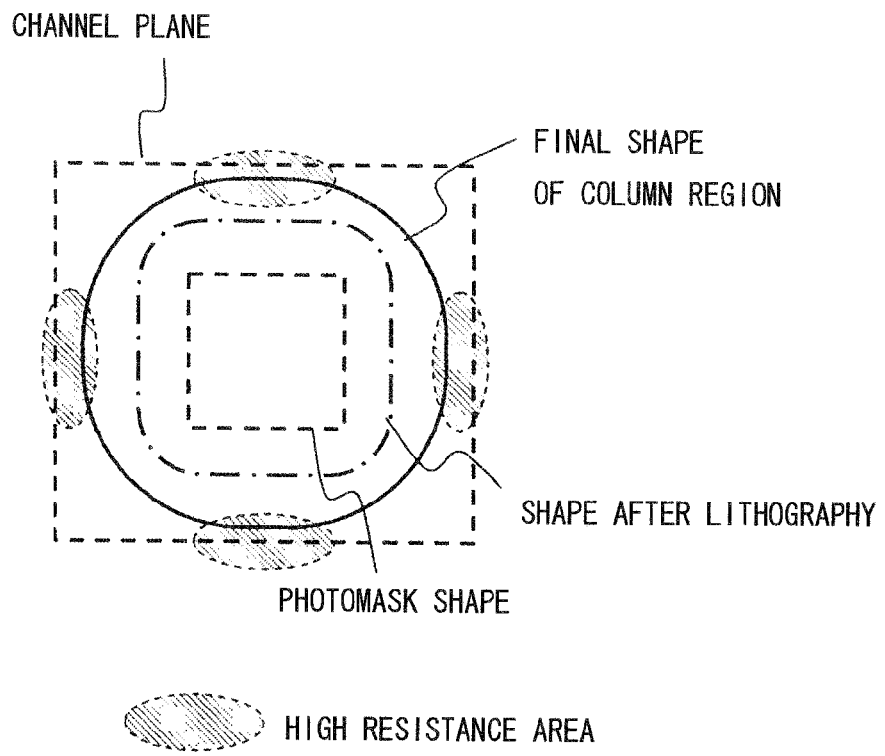
FIG. 9 is a view showing the halfway shapes during the process steps of the column region according to the related art.
Figure 10:
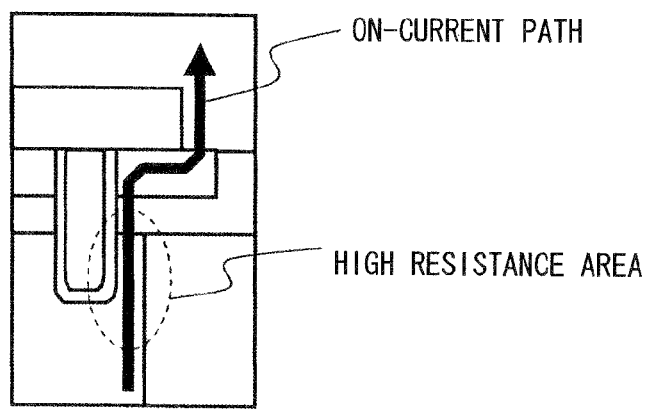
FIG. 10 is a view showing a current path when the power MOSFET is in the on-state according to the related art.

FIG. 10 shows a current path when the power MOSFET is in the on-state according to the related art. Because the corners of the column region is circular (cf. FIG. 9) in the power MOSFET 70, the distance from the column region to the gate insulating film is not uniform and is unequal. There is thus the area where the space between the channel and the column region is narrow. In such a narrow area, on-current is inhibited to cause high resistance.

Figure 4:
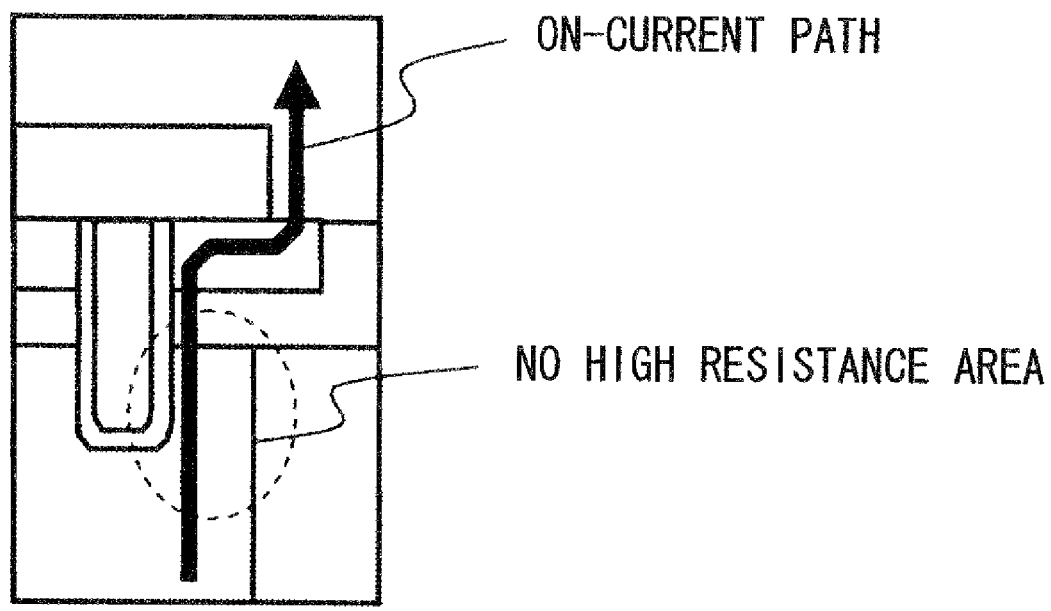
FIG. 4 is a view showing a current path when the power MOSFET is in the on-state according to the first embodiment.

FIG. 4 shows a current path when the power MOSFET 100 is in the on-state according to this embodiment. In the power MOSFET 100 of this embodiment, the distance from the column region 4 to the gate insulating film 7 is uniform. Thus, a high-resistance area does not exist, thus suppressing an increase in on-resistance.

As described in the foregoing, the column region 4 is formed in a rectangular shape with the use of the photomask having the compensation pattern in this embodiment. The compensation pattern is designed so as to compensate a deformation of the photo resist pattern caused by photo interference and a deformation of the ion implantation region diffused by the heat treatment. With the rectangular column region 4 that is finally formed, the distance from the final column region 4 to the gate insulating film 7 is uniform. The thickness of the channel is thus equalized. This eliminates a high-resistance portion which inhibits on-current, thereby suppressing an increase in on-resistance.

Further, the ion implantation region is formed so that it is closest to the gate electrode in the portion which corresponds to the corner of the gate electrode with a rectangular outer edge. With the ion implantation region having such a shape, the rectangular column region can be formed.

The mobility of electrons is maximum in the plane equivalent to the (100) plane. Thus, if a plane to serve as a channel is the plane equivalent to the (100) plane, the resistance in the channel region when the power MOSFET is in the on-state can be further lowered.

Second Embodiment

Figure 5A:
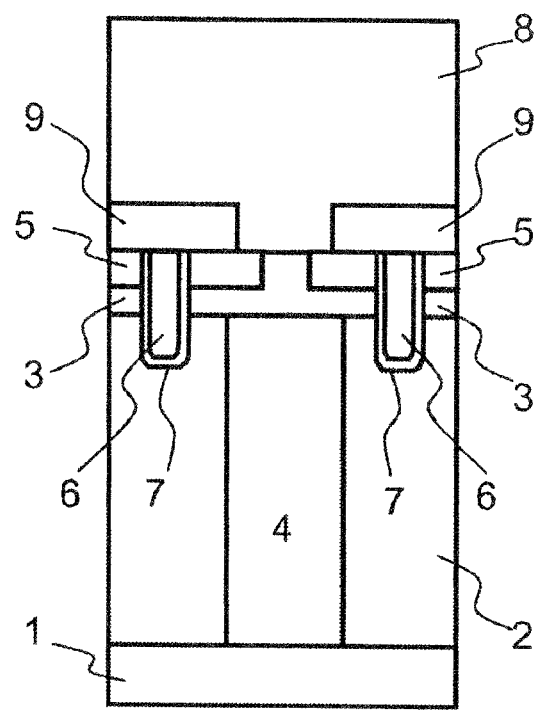
FIG. 5A is a view showing the sectional structure of a power MOSFET 200 according to a second embodiment of the present invention.
Figure 5B:
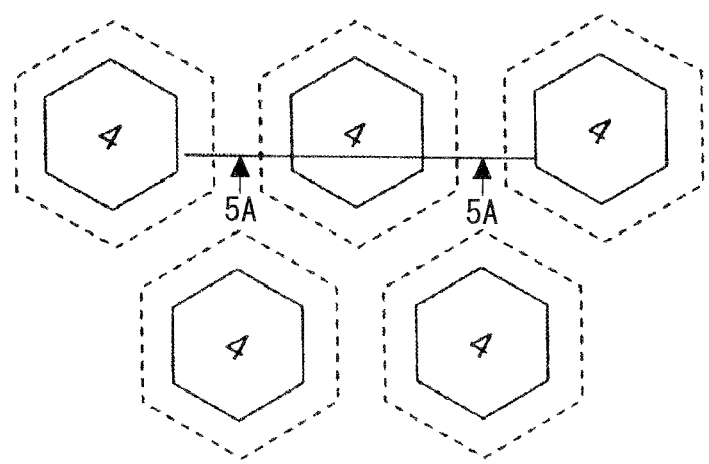
FIG. 5B a view showing the layout on the upper surface of the power MOSFET 200 according to the second embodiment.

FIGS. 5A and 5B show a semiconductor apparatus 200 according to a second embodiment of the present invention. In FIGS. 5A and 5B, the same elements as in FIGS. 1A and 1B are denoted by the same reference numerals and not described in detail herein. The sectional view of the semiconductor apparatus 200 shown in FIG. 5A is the same as the sectional view of the semiconductor apparatus 100 shown in FIG. 1A. In the plan view of the semiconductor apparatus 100 according to the first embodiment shown in FIG. 1B, each column region has a rectangular shape. On the other hand, in the plan view of the semiconductor apparatus 200 according to the second embodiment shown in FIG. 5B, each column region has a hexagonal shape. The distance from the hexagonal column region to the gate insulating film is uniform. A method of forming the column region in a hexagonal shape is described hereinbelow.

Figure 6:
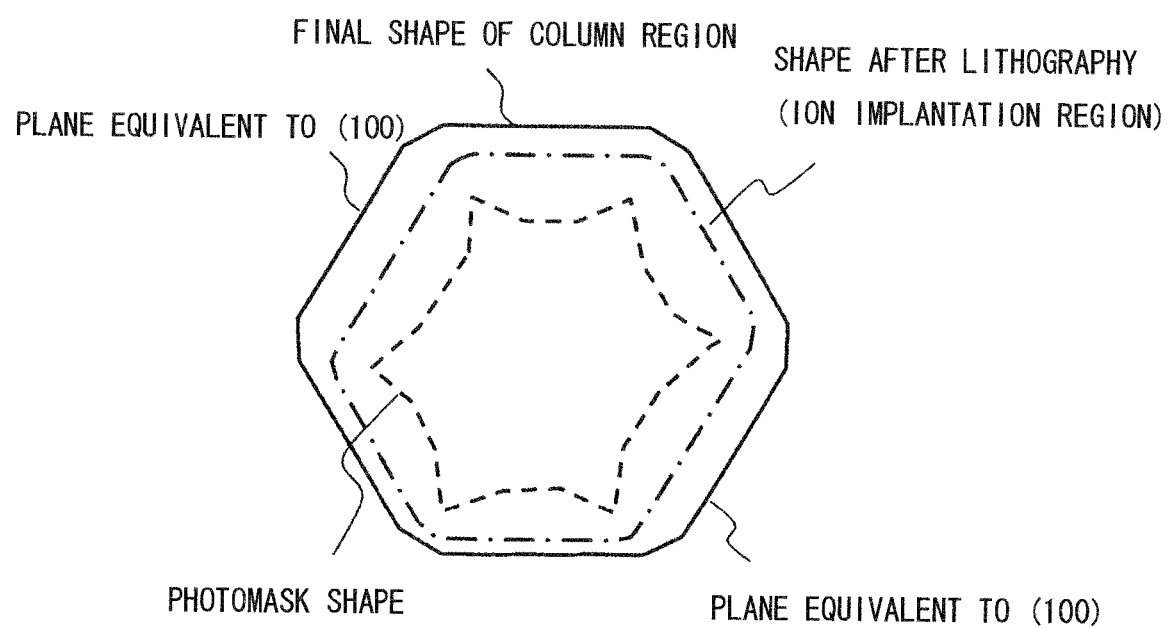
FIG. 6 is a view showing a compensation pattern of a mask when a column region is formed in a hexagonal shape according to the second embodiment.
Figure 7A:
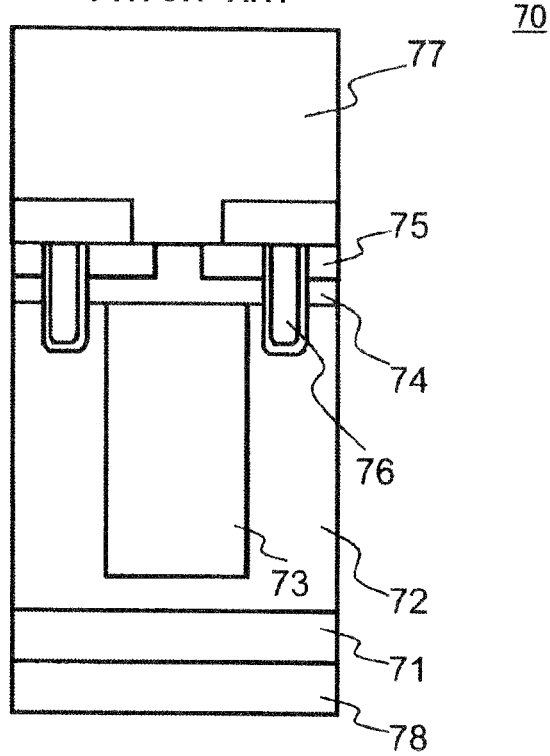
FIG. 7A is a view showing the sectional structure of a power MOSFET 70 according to a prior art.
Figure 7B:
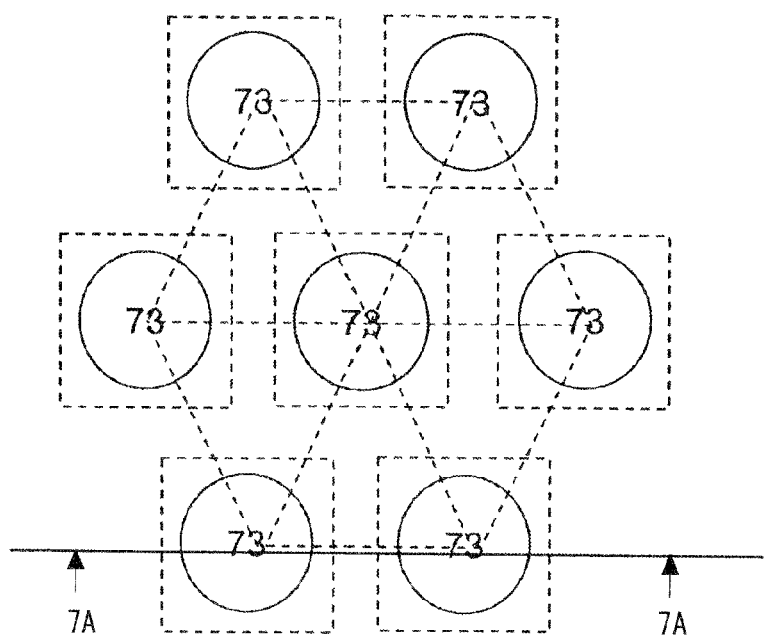
FIG. 7B a view showing the layout on the upper surface of the power MOSFET 70 according to the prior art.
Figure 8A:
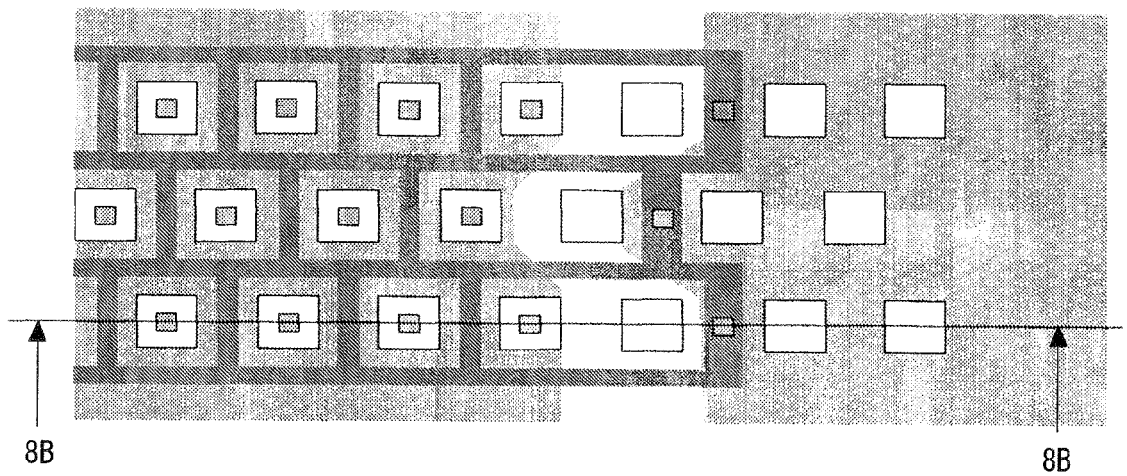
FIG. 8A is a view showing the layout on the upper surface of a power MOSFET 80 according to another prior art FIG. 8B a view showing the sectional structure of the power MOSFET 80 according to the prior art.
Figure 8B:
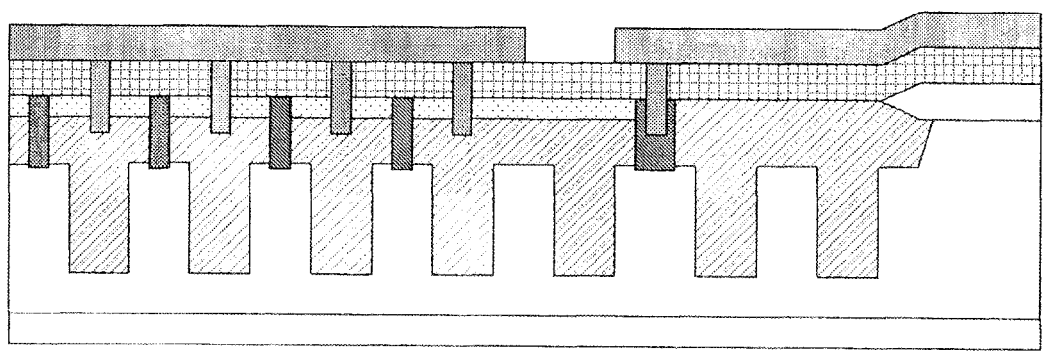

FIG. 6 shows a compensation pattern of a mask when a column region is formed in a hexagonal shape. The step of forming the final shape of the column region is the same as the step of forming the final shape of the column region which is described in the first embodiment and thus not repeatedly described herein.

In the case of forming the hexagonal column region also, the fact that the diffusion distance in the (100) plane is about 1.4 times longer than the diffusion distance in the (110) plane is taken into consideration. The photomask shape is formed as shown in FIG. 6 so that the final shape of the column region is hexagonal. Specifically, the photo resist pattern corresponding to the shape after lithography (the ion implantation region) is formed in such a way that the distance to the gate electrode is shortest in the portion corresponding to the corner of the gate electrode in the outer edge of the ion implantation region which corresponds to the shape after lithography and the distance to the gate electrode is longest at the middle of one side of the outer edge of the ion implantation region. As a result, the final shape of the column region becomes hexagonal. Thus, the distance from the column region to the gate insulating film is uniform. Further, the planes to serve as the channel are two planes equivalent to the (100) plane and the other four planes. The sides of the outer edge of the ion implantation region are formed in such a way the four sides of the hexagon which are along the four planes that are not equivalent to the (100) plane are farther from the channel plane than the two sides of the hexagon which are along the two planes that are equivalent to the (100) plane. The distance from the column region to the gate insulating film thereby becomes substantially uniform in the final shape of the column region.

As described in the foregoing, the column region is formed in a hexagonal shape with the use of the photomask having a compensation pattern in this embodiment. With the hexagonal column region, the channel thickness from the column region to the gate insulating film is uniform. This eliminates a high-resistance portion which inhibits on-current, thereby suppressing an increase in on-resistance.

Further, the ion implantation region is formed so that it is closest to the gate electrode at the portion corresponding to the corner of the gate electrode with a hexagonal outer edge. Forming the ion implantation region in such a shape enables the formation of the hexagonal column region.

Furthermore, in the power MOSFET which includes the column region according to the second embodiment, higher integration is possible under the same design conditions (with the same manufacturing facilities) compared with the power MOSFET which includes the column region according to the first embodiment. It is thereby possible to enlarge the channel width per unit area in the power MOSFET of the second embodiment than in the power MOSFET of the first embodiment.

According to the embodiments of the present invention, the photomask of the column region in the power MOSFET is formed in a prescribed shape. By making the distance from the final column region to the gate insulating film uniform, it is possible to eliminate a high-resistance portion which inhibits on-current, thereby achieving the suppression of an increase in on-resistance.

It is apparent that the present invention is not limited to the above embodiments, but may be modified and changed without departing from the scope and spirit of the invention.

What is claimed is:

1. A method of manufacturing a semiconductor apparatus with a superjunction structure including a column region, comprising:

forming a gate electrode in a mesh pattern in a crystalline semiconductor layer;

forming a photo resist pattern for forming an ion implantation region in the crystalline semiconductor layer, the photo resist pattern being formed by using a photomask, the photomask having a compensation pattern in such a way that the compensation pattern is surrounded by the gate electrode in a plane view and distances, measured using the line perpendicular from one linear edge of the gate electrode to the compensation pattern gradually change depending on a location on the one linear edge of the gate electrode, and the compensation pattern has a shape depending on an impurity diffusion coefficient along a crystal plane direction of said ion implantation region in the crystalline semiconductor layer;

forming the ion implantation region by using the photo resist pattern, wherein the ion(s) have at least two different diffusion coefficients in the crystalline semiconductor layer and the mask is formed of such a shape to compensate for the differences in the diffusion coefficients; and performing heat treatment on the crystalline semiconductor layer.

2. The method of manufacturing a semiconductor apparatus according to claim 1, wherein the compensation pattern is designed so as to compensate a deformation of the photo resist pattern caused by photo interference and a deformation of the ion implantation region diffused by the heat treatment.

3. The method of manufacturing a semiconductor apparatus according to claim 1, wherein the gate electrode in a mesh pattern is formed in a polygonal shape, and the outer edge of the ion implantation region is closest to the gate electrode at a portion corresponding to a corner of the gate electrode in the polygonal shape.

4. The method of manufacturing a semiconductor apparatus according to claim 1, wherein the gate electrode in a mesh pattern is formed in a polygonal shape, the outer edge of the ion implantation region has a first distance to the gate electrode at a portion corresponding to a corner of the gate electrode in the polygonal shape, and the outer edge of the ion implantation region has a second distance being longer than the first distance at a middle of a side of the gate electrode in the polygonal shape.

5. The method of manufacturing a semiconductor apparatus according to claim 3, wherein the gate electrode in a mesh pattern is formed in a polygonal shape, the outer edge of the ion implantation region has a first distance to the gate electrode at a portion corresponding to a corner of the gate electrode in the polygonal shape, and the outer edge of the ion implantation region has a second distance being longer than the first distance at a middle of a side of the gate electrode in the polygonal shape.

6. The method of manufacturing a semiconductor apparatus according to claim 1, wherein the outer edge of the ion implantation region has a first distance to the gate electrode at an edge corresponding to a plane equivalent to a (100) plane in the plane direction, and the outer edge of the ion implantation region has a second distance being longer than the first distance at a middle of a side of the gate electrode in the polygonal shape.

7. The method of manufacturing a semiconductor apparatus according to claim 3, wherein the outer edge of the ion implantation region has a first distance to the gate electrode at an edge corresponding to a plane equivalent to a (100) plane in the plane direction, and the outer edge of the ion implantation region has a second distance being longer than the first distance at a middle of a side of the gate electrode in the polygonal shape.

8. The method of manufacturing a semiconductor apparatus according to claim 4, wherein the outer edge of the ion implantation region has a first distance to the gate electrode at an edge corresponding to a plane equivalent to a (100) plane in the plane direction, and the outer edge of the ion implantation region has a second distance being longer than the first distance at a middle of a side of the gate electrode in the polygonal shape.

9. A method of manufacturing a semiconductor apparatus with a superjunction structure including a column region, comprising:

forming a gate electrode in a mesh pattern in a crystalline semiconductor layer;

forming a photo resist pattern for forming an ion implantation region in the crystalline semiconductor layer, the photo resist pattern being formed by using a photomask, the photomask having a compensation pattern in such a way that the compensation pattern is surrounded by the gate electrode in a plane view and distances, measured using the line perpendicular from one linear edge of the gate electrode to the compensation pattern gradually change depending on a location on the one linear edge of the gate electrode, and the compensation pattern has a shape depending on an impurity diffusion coefficient along a crystal plane direction of said ion implantation region in the crystalline semiconductor layer; and forming the ion implantation region by using the photo resist pattern, wherein the ion(s) have at least two different diffusion coefficients in the crystalline semiconductor layer and the mask is formed of such a shape to compensate for the differences in the diffusion coefficients, wherein the compensation pattern has at least four curved sides and at least four sharp corners.

* * * * *